Oct. 21, 1969 O. R. RYERSON ET AL 3,474,261

LOW VOLTAGE-LOW POWER MULTIVIBRATOR

Filed Dec. 20, 1966

WITNESSES
Theodore F. Wrobel
James F. Young

INVENTORS
OLAF R. RYERSON
DIETER DORING
BY Dean Schron
ATTORNEY

United States Patent Office 3,474,261
Patented Oct. 21, 1969

3,474,261

LOW VOLTAGE-LOW POWER MULTIVIBRATOR

Olaf R. Ryerson, Laurel, and Dieter Doring, Linthicum Heights, Md., assignors to Westinghouse Electric Corporation, Pittsburgh, Pa., a corporation of Pennsylvania
Filed Dec. 20, 1966, Ser. No. 603,310
Int. Cl. H03k 3/26
U.S. Cl. 307—291 3 Claims This invention in general relates to logic circuits, and in particular, to a high speed-low voltage multivibrator.

In general, transistor multivibrator circuits include first and second transistor stages with suitable feedback arrangements between the stages to achieve desired multivibrator action. Each transistor generally includes a load resistor which in many circuits impairs rise times and reduces the efficiency of the circuit. Accordingly, many multivibrator circuits when fabricated in integrated circuit form have eliminated the conventional load resistors and have replaced them by transistors. Such an arrangement also reduces the power dissipation, a prime consideration in integrated circuits.

Such multivibrators fabricated as integrated circuits maintain fast rise times and high speeds of operation with supply voltages of several volts; however, at lower supply voltages, the counting rates decrease, and if the supply voltage decreases below approximately 1.5 volts, reliable operation may be destroyed.

It is, therefore, one object of the present invention to provide an improved multivibrator circuit which may be designed to operate with extremely small supply voltages.

Another object is to provide a multivibrator having low power dissipation characteristics.

Another object is to provide an extremely reliable multivibrator circuit.

Yet another object is to provide a multivibrator circuit which may be readily fabricated in integrated circuit form.

Briefly, in accordance with the above objects, there is provided a low power logic circuit which includes a first transistor stage having at least a first stage transistor and a second transistor stage having at least a second stage transistor with the first and second transistor stages being cross connected for multivibrator action.

A pair of normally off transistors is provided, each one being uniquely connected to a respective transistor in each stage.

A source of input trigger pulses is provided for selectively and momentarily turning on one transistor of the pair to establish a conductive current path for the transistor to which it is uniquely connected, after which the turned on transistor of the pair reverts to its off condition.

The above stated as well as further objects and advantages of the present invention will become apparent upon reading the following detailed specification taken in conjunction with the drawings, in which.

Figure 1:
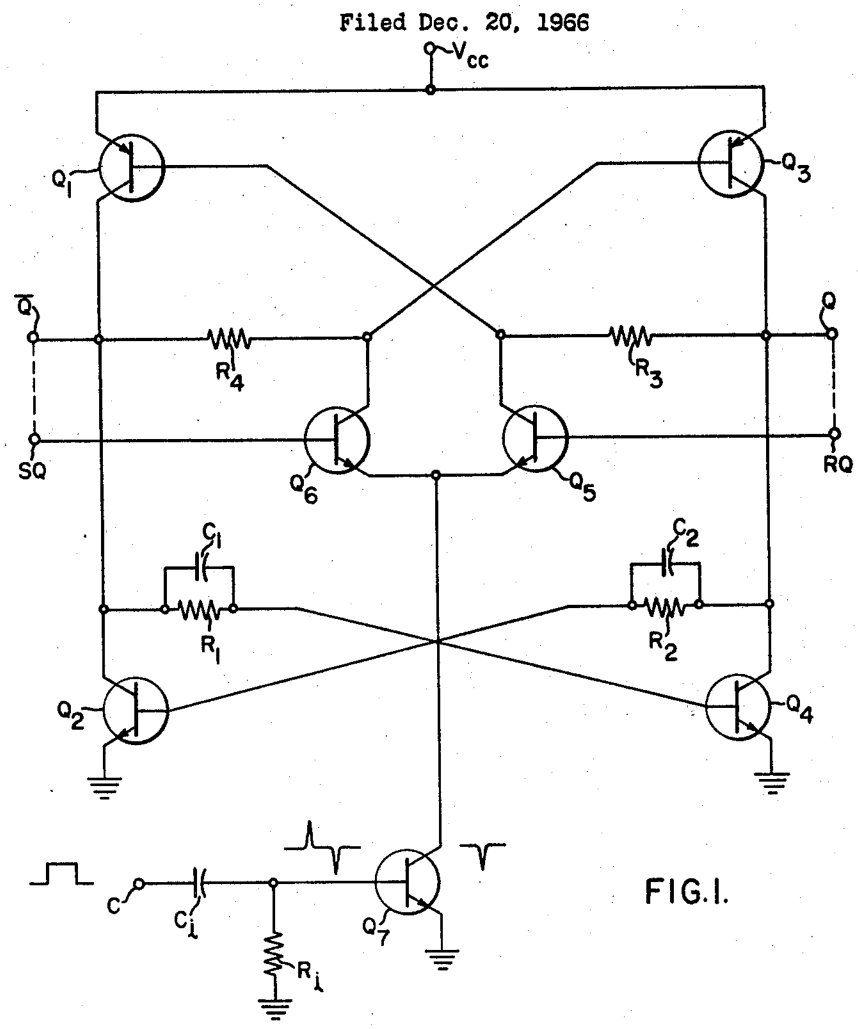
FIGURE 1 is a circuit diagram of one embodiment of the present invention.

Referring now to FIG. 1, there is illustrated a logic circuit including a first stage having first and second connected transistors $Q_1$ and $Q_2$ and a second stage having third and fourth connected transistors $Q_3$ and $Q_4$, with suitable feedback or cross coupling arrangements for achieving multivibrator action. By way of example, the collector of transistor $Q_2$ is connected through the parallel arrangement of resistor $R_1$ and capacitor $C_1$ to the base of $Q_4$, and similarly, the collector of $Q_4$ is connected to the base of transistor $Q_2$ through the parallel arrangement of resistor $R_2$ and capacitor $C_2$.

The base of transistor $Q_1$ is connected through resistor $R_3$ to the collector of transistor $Q_4$ and the base of transistor $Q_3$ is connected to the collector of transistor $Q_2$ through resistor $R_4$. The junction between PNP transistor $Q_3$ and NPN transistor $Q_4$ constitutes a first output terminal Q and the junction between PNP transistor $Q_1$ and NPN transistor $Q_2$ constitutes a second output terminal $\overline{Q}$.

The emitters of transistors $Q_1$ and $Q_3$ are connected to a source of operating potential $V_{cc}$ and the emitters of transistors $Q_2$ and $Q_4$ are connected to a source of reference potential illustrated as ground. In one state of operation, transistors $Q_1$ and $Q_4$ are on, while transistors $Q_2$ and $Q_3$ are off, and in an opposite state of operation transistors $Q_2$ and $Q_3$ are on while transistors $Q_1$ and $Q_4$ are off. The circuit thus far described is typical of a prior art multivibrator arrangement. The capability of operating at an extremely low supply voltage $V_{cc}$, for example in the order of 1.0 to 1.5 volts, is accomplished by the provision of a pair of normally off transistors $Q_5$ and $Q_6$ with the collector-emitter current path of transistor $Q_5$ being ohmically connected to the emitter-base current path of transistor $Q_1$, and the collector-emitter current path of transistor $Q_6$ being ohmically connected with the emitter-base current path of transistor $Q_3$. The emitters of transistors $Q_5$ and $Q_6$ are commonly connected to a source of input trigger pulses which includes transistor $Q_7$ having its base connected to an input differentiation network comprising capacitor $C_1$ and resistor $R_1$. The bases of transistors $Q_5$ and $Q_6$ form input electrodes RQ and SQ respectively.

Figure 2:
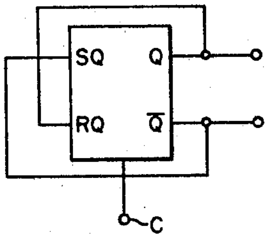
FIG. 2 illustrates in block form input and output connections for the circuit of FIG. 1 to achieve binary action.

In FIG. 2, there is illustrated the circuit of FIG. 1 in block form with suitable connections for a binary counting operation. It is seen that the output terminal $\overline{Q}$ is connected to input terminal SQ and output terminal Q is connected to input terminal RQ. With reference back to FIG. 1, these connections are illustrated by the dotted lines connecting Q and RQ and $\overline{Q}$ and SQ.

To demonstrate the operation of the multivibrator of FIG. 1, an example will be considered wherein the supply voltage $V_{cc}$ is equal to 1.0 volt. Arbitrarily assuming that $Q_1$ and $Q_4$ are on, the emitter-base current of transistor $Q_1$ flowing through resistor $R_3$ forms the collector current for transistor $Q_4$, and the collector current of transistor $Q_1$ flowing through resistor $R_1$ forms the base current of transistor $Q_4$. With the low voltage supply, the voltage drop across any on transistor is assumed to be in the order of 0.06 volt; therefore, the output voltage at terminal Q since it is connected to the collector of transistor $Q_4$ is 0.06 volt and may be considered as a binary ZERO while the voltage at output terminal $\overline{Q}$ is 0.94 volt, that is, the supply voltage minus the voltage drop across transistor $Q_1$, and may be considered as a binary ONE. The low voltage appearing at the collector of transistor $Q_4$ is applied to the base of transistor $Q_2$ and maintains it in a cutoff state and the high voltage appearing at output terminal $\overline{Q}$ insures that transistor $Q_3$ (since the voltage is coupled to its base) remains in an off condition.

Transistor $Q_5$ has a low voltage applied to its base from output terminal Q while transistor $Q_6$ has the higher voltage from output terminal $\overline{Q}$ applied to its base; however, neither transistor $Q_5$ nor $Q_6$ is able to conduct since transistor $Q_7$ is in an off condition.

With the application of an input signal to input terminal C, a differentiation is performed whereby transistor $Q_7$ receives a positive going spike and then a negative going spike as an input signal. The positive going signal serves to turn on transistor $Q_7$ thereby dropping the potential at its collector and therefore at the emitters of the transistors $Q_5$ and $Q_6$. Since a low voltage is applied to the base of transistor $Q_5$, only transistor $Q_6$ will be placed into conduction by the application of the input trigger pulse. The conduction of transistor $Q_6$ affords a current path for base current to turn on transistor $Q_3$. When transistor $Q_3$ turns on, its collector potential rises toward the supply $V_{cc}$ and this rise in potential is coupled through capacitor $C_2$ to turn on transistor $Q_2$. As transistor $Q_2$ turns on, the lowering of its collector potential is coupled through capacitor $C_1$ to the base of transistor $Q_4$ to cut it off. When the switching action is complete, transistor $Q_7$ is in a cutoff condition, transistors $Q_5$ and $Q_6$ are again nonconducting, and transistors $Q_2$ and $Q_3$ are conducting while transistors $Q_1$ and $Q_4$ are cutoff, with the output voltage at terminal Q representing a binary ONE and the output voltage at terminal $\overline{Q}$ representing a binary ZERO.

With a high voltage being applied to the base of transistor $Q_5$ and a low voltage being applied to the base of transistor $Q_6$, only transistor $Q_5$ will conduct upon the application of a subsequent input signal at terminal C to thereby complete a current path for emitter-base current of transistor $Q_1$ to begin the cumulative action of switching.

Figure 3:
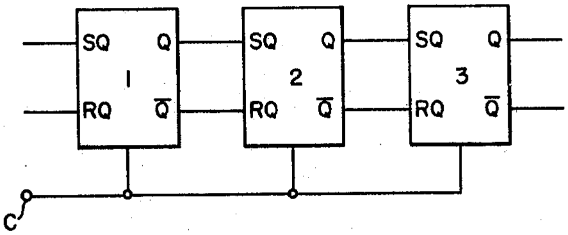
FIG. 3 illustrates the input and output connections of the circuit of FIG. 1 for use as a shift register.

The dotted connections in FIG. 1 illustrate the connections to be made for binary counting action. The multivibrator of FIG. 1 finds utility in other arrangements one of which is illustrated in FIG. 3 showing three stages 1, 2 and 3, of multivibrators as illustrated in FIG. 1 together with the proper connections to be made between adjacent stages. Basically, upon the application of an input signal to line C, the information appearing at output terminals Q and $\overline{Q}$ of stage 1 is shifted to stage 2, information in stage 2 is shifted to stage 3 and the information in stage 3 is shifted to a subsequent or output stage not shown.

Accordingly, there has been described a multivibrator circuit which may utilize an extremely low supply voltage while still maintaining proper multivibrator action in providing well defined binary logic signals in response to certain input signal conditions. The high frequency operation of the multivibrator is maintained at the lower supply voltage and extremely low power levels can be attained.

Although the present invention has been described with a certain degree of particularity, it should be understood that the present disclosure has been made by way of example and that modifications and variations of the present invention are made possible in the light of the above teachings.

What is claimed is:

1. A low power logic circuit comprising:
(A) a first transistor stage including first and second transistors each having an electrode commonly connected to a first circuit point;
(B) a second transistor stage including third and fourth transistors each having an electrode commonly connected to a second circuit point;
(C) said first and second transistor stages being cross connected for multivibrator action;
(D) a first normally off transistor;
(E) a second normally off transistor;
(F) the collector of said first normally off transistor beig connected to the base of said first transistor;
(G) the collector of said second normally off transistor being connected to the base of said third transistor;
(H) the bases of said first and second normally off transistors being for receipt of respective input signals;
(I) a source of input trigger pulses for selectively and momentarily turning on one of said first or second normally off transistors for establishing a conductive current path for the transistor to which the selectively turned on transistor is connected;
(J) the emitters of said first and second normally off transistors being connected together;
(K) said source of input trigger pulses being connected to the commonly connected emitters of said first and second normally off transistors;
(L) a third normally off transistor connecting the emitters of said first and second normally off transistors with a reference potential; and
(M) means for momentarily turning on said third normally off transistor.

2. A circuit according to claim 1 wherein:
(A) output terminals are connected between
(1) the first and second transistors; and
(2) the third and fourth transistors; and
(B) the bases of the first and second normally off transistors are connected to a respective one of said output terminals.

3. A circuit according to claim 1 wherein
(A) the collector of the first normally off transistor is ohmically connected to the base of the first transistor; and
(B) the collector of the second normally off transistor is ohmically connected to the base of the first transistor.

References Cited

UNITED STATES PATENTS

| | | | |
|---|---|---|---|
| 3,010,031 | 11/1961 | Baker | 307—292 X |
| 3,067,336 | 12/1962 | Eachus | 307—292 X |
| 3,237,024 | 2/1966 | Mavity | 307—292 |

JOHN S. HEYMAN, Primary Examiner

J. D. FREW, Assistant Examiner

U.S. Cl. X.R.

307—292